(12) United States Patent
Angermann

(10) Patent No.: US 9,837,594 B2
(45) Date of Patent: Dec. 5, 2017

(54) THERMOELECTRIC MODULE, METHOD FOR PRODUCING A THERMOELECTRIC MODULE AND USE OF A METALLIC GLASS OR A SINTERED MATERIAL

(75) Inventor: Hans-Heinrich Angermann, Stuttgart (DE)

(73) Assignee: MAHLE INTERNATIONAL GMBH, Stuttgart (DE)

( * ) Notice: Subject to any disclaimer, the term of this patent is extended or adjusted under 35 U.S.C. 154(b) by 0 days.

(21) Appl. No.: 14/233,983

(22) PCT Filed: Jul. 20, 2012

(86) PCT No.: PCT/EP2012/064288
§ 371 (c)(1),
(2), (4) Date: Mar. 3, 2014

(87) PCT Pub. No.: WO2013/011127
PCT Pub. Date: Jan. 24, 2013

(65) Prior Publication Data
US 2014/0209139 A1    Jul. 31, 2014

(30) Foreign Application Priority Data

Jul. 20, 2011  (DE) .................. 10 2011 079 467

(51) Int. Cl.
*H01L 35/32* (2006.01)
*H01L 35/10* (2006.01)
*C22C 1/00* (2006.01)
*C22C 45/10* (2006.01)
(Continued)

(52) U.S. Cl.
CPC ............... *H01L 35/32* (2013.01); *B22F 7/08* (2013.01); *C22C 1/002* (2013.01); *C22C 45/10* (2013.01); *H01L 35/10* (2013.01); *H01L 35/34* (2013.01)

(58) Field of Classification Search
CPC .......... H01L 35/10; H01L 35/32; H01L 35/34
See application file for complete search history.

(56) References Cited

U.S. PATENT DOCUMENTS

| 3,859,143 A | 1/1975 | Krebs |
| 4,339,255 A | 7/1982 | Ovshinsky et al. |
| 4,639,543 A | 1/1987 | Fang |

(Continued)

FOREIGN PATENT DOCUMENTS

| CN | 100595940 C | 3/2010 |
| DE | 1 558 644 A1 | 2/1972 |

(Continued)

OTHER PUBLICATIONS

Peker et al., "A highly processable metallic glass: $Zr_{41.2}Ti_{13.8}Cu_{12.5}Ni_{10.0}Be_{22.5}$", Applied Physics Letters, vol. 63, No. 17 (1993), 3 pgs.

(Continued)

*Primary Examiner* — Golam Mowla
(74) *Attorney, Agent, or Firm* — Paul D. Strain, Esq.; Strain & Strain PLLC

(57) ABSTRACT

The invention relates to a thermoelectric module, having an electric insulation, an electric conductor path, one surface of the electric conductor path being attached to a surface of the electrical insulation, and a thermoelectric material, one surface of the thermoelectric material being attached to another surface of the conductor path.

8 Claims, 2 Drawing Sheets

(51) Int. Cl.
  *B22F 7/08* (2006.01)
  *H01L 35/34* (2006.01)

(56) References Cited

U.S. PATENT DOCUMENTS

| | | | |
|---|---|---|---|
| 4,855,810 A * | 8/1989 | Gelb et al. | 136/203 |
| 5,866,254 A | 2/1999 | Peker et al. | |
| 6,444,893 B1 * | 9/2002 | Onoue et al. | 136/203 |
| 6,492,585 B1 * | 12/2002 | Zamboni et al. | 136/201 |
| 2002/0024154 A1 | 2/2002 | Hara et al. | |
| 2002/0179135 A1 | 12/2002 | Shutoh et al. | |
| 2004/0255647 A1 | 12/2004 | Lin et al. | |
| 2007/0034305 A1 | 2/2007 | Suh | |
| 2007/0056620 A1 * | 3/2007 | Bahr et al. | 136/201 |
| 2009/0025772 A1 | 1/2009 | Dannoux et al. | |
| 2009/0032970 A1 | 2/2009 | Park et al. | |

FOREIGN PATENT DOCUMENTS

| | | |
|---|---|---|
| DE | 103 32 388 B3 | 8/2004 |
| DE | 10 2007 046 901 A1 | 4/2009 |
| DE | 10 2011 005 246 A1 | 9/2012 |
| EP | 1 835 551 A1 | 9/2007 |
| JP | 2003-17759 A | 1/2003 |
| JP | 2003-282796 A | 10/2003 |
| JP | 2004-63585 A | 2/2004 |
| JP | 2004-273489 A | 9/2004 |
| JP | 2005-123235 A | 5/2005 |
| WO | WO 2010/144487 A2 | 12/2010 |
| WO | WO 2011/026624 A1 | 3/2011 |

OTHER PUBLICATIONS

International Search Report, PCT/EP2012/064288, Jan. 18, 2013, 3 pgs.
German Search Report, DE 10 2011 079 467.0, May 18, 2012, 5 pgs.
The Micro Mechanical Property Research on Bulk Amorphous Alloy and Composite Material Thereof, Li Weihuo, (2009), pp. 1-5.
Shenzhen High-Tech Pandect, Book Two, Gu Ke, published on 1999, p. 982, Table 1-9.
Nano and New Material Album, Zhang Ming, published on 2003, p. 242.

* cited by examiner

THERMOELECTRIC MODULE, METHOD FOR PRODUCING A THERMOELECTRIC MODULE AND USE OF A METALLIC GLASS OR A SINTERED MATERIAL

CROSS-REFERENCE TO RELATED PATENT APPLICATIONS

This application is a National Stage of International Application No. PCT/EP2012/064288, filed Jul. 20, 2012, which is based upon and claims the benefit of priority from prior German Patent Application No. 10 2011 079 467.0, filed Jul. 20, 2011, the entire contents of all of which are incorporated herein by reference in their entirety.

The present invention relates to a thermoelectric module, to a method for producing a thermoelectric module and to a use of a metallic glass or of a sintered material as a material for a conductor track of a thermoelectric module.

Thermoelectric modules are produced using joining materials. With respect to joining materials, soft soldering connections can be easily implemented and are also often used. The parties to the join must, under certain circumstances, simply be metallized. These joints are, however, limited in terms of their maximum temperature by the remelting temperature of the soft solder connection. However, joining seam fractures due to thermal cycling can also occur the Sn base below the solidus temperature of the solder.

In German patent application 10 2011 005 246.1 it is proposed firstly to construct a thermoelectric module from materials with similar coefficients of thermal expansion and secondly to produce the module either step by step by thermal spraying or to join on existing thermoelectric modules by means of soldering or Ag pressure sintering. The theoretically correct way of construction completely by means of thermal spraying is in practice difficult to implement since the construction of the thermoelectric materials has to take place by means of the thermal spraying with the exclusion of air and the thermoelectric materials which are subject to oxidation and are in themselves not so readily available have to be sprayed in powder form.

German patent application 10 2011 075 902.6 discloses a module which is constructed from basic elements and TE modules which are provided by means of thermal pressing techniques. It is to be noted again that materials with the same or similar coefficient of thermal expansion are used. However, it is not always possible to use such materials since other peripheral conditions also have to be met by the materials. It would be desirable to have a greater degree of freedom in the selection of materials.

The object of the present invention is to provide an improved thermoelectric module, an improved method for producing a thermoelectric module and a new use of a metallic glass or of a sintered material.

This object is achieved by means of a thermoelectric module, a method for producing a thermoelectric module and by a use of a metallic glass or of a sintered material according to the main claims.

Thermoelectric modules are used on as Peltier elements and as thermoelectric generators. The underlying construction for both applications is the same. Firstly, an electrically non-conductive layer, for example made of ceramic, on the outside provides electric insulation. In the interior of the modules there are thermoelectrically active materials which are joined to electric conductor tracks and connected to one another in a way which permits good conduction of electricity.

It is desirable to have a temperature difference between the hot and the cold sides which is as large as possible both in the case of the application as a Peltier element and in the case of the application as a thermoelectric generator. In the case of the Peltier element, for the heating and cooling a temperature which is as high as possible is to be implemented on the hot site and a temperature which is as low as possible is to be implemented on the cold side. In the case of the thermoelectric generator, the generation of voltage and current is maximized by a temperature difference which is as large as possible between the hot and cold sides. Since the temperatures are reached quickly when the modules are powered up, temperature differences and the use of materials with different coefficients of thermal expansion correspondingly result in high thermomechanical stress from one of the ceramic covering layers via the conductor tracks, joining materials and thermoelectric materials to the other ceramic covering layer. The higher the temperatures at which the components are operated, the higher the thermomechanical loading and therefore the risk that the components will fail prematurely during operation.

According to the described approach, no separate joining material is used to join conductor tracks of a thermoelectric module at its periphery. Instead, the conductor tracks function both as current conductors and also as joining material during the production of the module. Solid metallic glasses are proposed as the material for the conductor tracks, or alternatively sintered materials, preferably based on Ag. The joining of the conductor tracks with a ceramic covering layer of the thermoelectric module and the joining of the thermoelectric materials of the thermoelectric module to the conductor tracks can preferably take place in one step. However, separate joining steps are also possible. For the joining of all the conductor tracks, or at least one conductor track, of the thermoelectric module it is possible to dispense with a separate joining material. The proposed technique can be used on both sides or just on one side of the thermoelectric module. The teaching which is used as the basis here regarding materials and methods for joining within thermoelectric modules in a way which conducts electricity well and is thermomechanically durable permits application of the thermoelectric modules at relatively high temperatures of more than 200° C.

This advantageously results in a greater degree of freedom in the selection of materials for the basic material, electric insulation and TE material through the absorption of stresses in the joint conductor track, simple joining with known methods and a possibility for building a thermoelectric module for raised or high temperatures.

The present invention provides a thermoelectric module, having the following features:
an electric insulation;
an electric conductor track, wherein a surface of the electric conductor track is joined to a surface of the electric insulation; and
a thermoelectric material, wherein a surface of the thermoelectric material is joined to a further surface of the electric conductor track.

A thermoelectric module can be regarded as being an electrothermal transducer. The thermoelectric module can be used both as a Peltier element, in which a flow of current brings about a difference in temperature, and as a thermoelectric generator, in which a temperature difference brings about a flow of current. These effects of the thermoelectric module can be caused by an electrically conductive connection of two semiconductors with different energy levels, for example a p-type semiconductor and an n-type semiconductor. The electric insulation, the electric conductor track and the thermoelectric material can be arranged in a layer structure or stacked one on top of the other. The electric insulation can extend as a layer or on a piece of sheet metal over an entire base surface of the thermoelectric module. The electric insulation can be arranged on a layer made of a metallic basic material. The electric conductor track can be one of a multiplicity of electric conductor tracks arranged the electric insulation. The electric conductor track is designed to provide an electrically conductive connection between a plurality of thermoelectric materials, for example between two different thermoelectric materials of the thermoelectric module. The thermoelectric material can be a semiconductor. The thermoelectric material can implement one of a multiplicity of thermoelectric elements of the thermoelectric module. The thermoelectric material can be a p-doped or an n-doped semiconductor material. In each case two thermoelectric elements which are composed of different thermoelectric material can be connected to one another in an electrically conductive fashion via an electric conductor track. The surface of the electric insulation can be composed of a main material of the electric insulation. The surface can also be formed by a metallization or adhesive means arranged on the main material of the electric insulation, for example of a nickel alloy. An adhesive layer or metallization layer which forms the surface of the electric insulation can have a thickness which is customary for metallizations, for example from 5 to 15 µm. A material of the surface of the electric insulation may be unsuitable as a soft solder. A material of the surface of the electric insulation can have a melting temperature which is above 200° C. The surface of the thermoelectric material can be composed of the thermoelectric material. The surface of the thermoelectric material can also be composed of a diffusion barrier or adhesive layer which is arranged on the thermoelectric material. A material of the surface of the thermoelectric material may in turn be unsuitable as a soft solder. The respective surfaces of the thermoelectric material can be combined by a joining method. Here, joining can be understood as being a pressing process. The joining method which produces the joints between the surfaces can therefore be mainly based on the application of pressure. The joining may also be by pressing. As a result, the joining connection between the individual surfaces can be implemented in such a way that the surfaces are in direct contact and there is a mechanical bond, and not a chemical bond, between the materials of the joined surfaces. There is therefore no additional joining material such as, for example, soft solder between the surfaces.

The electric conductor track can be composed of a metallic glass. The metallic glass can be a solid metallic glass. The metallic glass can be an alloy which has an amorphous structure on an atomic level. Metallic glass is suitable as an electric conductor track since it is electrically conductive, has a high melting temperature or softening temperature and is suitable for absorbing thermomechanical stresses.

The electric conductor track can also be composed of a sintered material. In particular, it can be a sintered metallic material, for example on a silver basis. Such a material is electrically conductive and has a porous surface which is readily available.

The coefficients of thermal expansion of the electric insulation, of the electric conductor track and of the thermoelectric material can be matched to one another. The teaching proposed in DE 10 2011 005 246.1 can be fully adopted for this purpose. For example, the coefficients of expansion can be within a tolerance range of 10% of the maximum coefficient of thermal expansion.

For example, the coefficients of thermal expansion can be graduated along a cross section through the thermoelectric module. It is therefore possible for the coefficient of thermal expansion of the electric insulation to be lower than the coefficient of thermal expansion of the electric conductor track, and for the coefficient of thermal expansion of the electric conductor track to be lower than the coefficient of thermal expansion of the thermoelectric material.

The thermoelectric module can have a further electric conductor track which is arranged on a side of the thermoelectric material lying opposite the electric conductor track. In addition, the thermoelectric module can have further electric insulation which is arranged on a side of the further electric conductor track lying opposite the thermoelectric material. The further electric conductor track can be soldered to the thermoelectric material and to the further electric insulation. Alternatively, adjoining surfaces of the further electric conductor track and of the further electric insulation as well as of the further electric conductor track and of the thermoelectric material can be joined to one another as described, that is to say can be connected to one another permanently without entering into a chemical bond. At the same time, the electric conductor track and the further electric conductor track can each be composed of metallic glass, in each case of a sintered material. The electric conductor track can also be composed of metallic glass, and the further electric conductor track can be composed of a sintered material, or vice versa. The coefficient of thermal expansion of the materials used for the individual layers can be matched to one another as already described, and in particular also be graduated.

The present invention also provides a method for producing a thermoelectric module which comprises the following steps:

providing electric insulation;
joining a surface of an electric conductor track to a surface of the electric insulation; and
joining a surface of a thermoelectric material to a further surface of the electric conductor track.

The joining steps can be carried out as pressing. In this way, the surfaces can be mechanically connected to one another by the surface structures of the directly adjoining and touching surfaces hooking one into the other. In this case it is possible to have recourse to known joining methods. Before the step of joining the electric conductor track it is possible to carry out a step of arranging the electric conductor track on the electric insulation. In the case of a thermoelectric module which comprises a multiplicity of electric conductor tracks it is possible for the multiplicity of electric conductor tracks to be arranged simultaneously on the electric insulation in the arranging step and to be attached simultaneously to the electric insulation in the joining step. Before the step of joining the thermoelectric material it is possible to carry out a step of arranging the thermoelectric material on the electric conductor track. In the case of a thermoelectric module comprising a multiplicity of thermoelectric elements formed from thermoelectric material it is possible for the thermoelectric material which forms the multiplicity of thermoelectric elements to be arranged simultaneously in the arranging step, or in the case of two different thermoelectric materials to also be arranged on the electric insulation in two steps, and joined simultaneously to the electric insulation in the joining step. The electric insulation can be applied by means of thermal spraying onto a basic material, as proposed in German patent application 10 2011 005 246.1. The joining steps can be carried out simultaneously or separately in chronological terms.

According to one embodiment, the joining steps can be carried out simultaneously as a pressing process. As a result, the production method can be simplified and speeded up.

The method can comprise a step of laying the electric conductor track composed of metallic glass onto the electric insulation. This is appropriate if the electric conductor track is already pre-fabricated.

Alternatively, the method can comprise a step of spraying a conductor track material, forming the electric conductor track which is composed of metallic glass, onto the electric insulation. In this case, the electric conductor track can be formed directly on the electric insulation.

The method can also comprise a step of sintering the electric conductor track composed of a sintered material onto the electric insulation. For this purpose, a basic material of the electric conductor track can be firstly applied to the electric insulation and joined. DE 10 2007 046 901 A1 and WO 2011/026624 A1 disclose metal pastes which contain a silver compound and which sinter to form a stable porous Ag layer at temperatures below 300 or respectively below 200° C. In this case, the joining steps can be carried out in a pressureless fashion or with an application of pressure.

The method can comprise a step of joining a surface of a further electric conductor track to a surface of the thermoelectric material lying opposite the electric conductor track, and a step of joining a surface of a further electric insulation to a surface of the further electric conductor track lying opposite the thermoelectric material. In this way, a thermoelectric module can be produced whose conductor tracks are each connected to the respectively adjoining materials on opposite sides of the thermoelectric material, in each case by means of a joint.

The present invention also provides a use of a metallic glass or of a sintered material as a material for a conductor track of a thermoelectric module. The thermoelectric module can be constructed or produced as described.

Advantageous exemplary embodiments of the present invention are explained in more detail below with reference to the appended drawings, in which.

In the following description of the preferred exemplary embodiments of the present invention, identical or similar reference symbols are used for the similarly acting elements which are illustrated in the various drawings, with a repeated description of these elements being omitted.

Thermoelectric modules are used both as Peltier elements and as thermoelectric generators. The basic design for both applications is the same. Initially, an electrically non-conductive layer, for example made of ceramic, on the outside provides electric insulation. In the interior of the modules there are thermoelectrically active materials which are joined to electric conductor tracks and connected to one another in a way which conducts electricity well.

Figure 1:
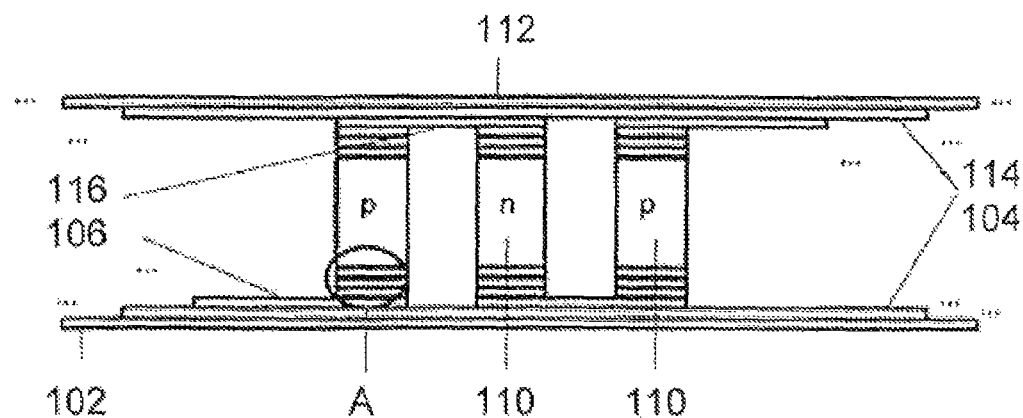
FIG. 1 shows an illustration of a thermoelectric module.

FIG. 1 shows an illustration of a thermoelectric module. The thermoelectric module has a layered construction composed of a metallic basic material 102, an electric insulation 104, conductor tracks 106, joining material, thermoelectric p-type and n-type material 110, further joining material, further conductor tracks 116, further electric insulation 114 and a further metallic basic material 112. During operation of the thermoelectric module, the metallic basic material 102 can be arranged on a cold side of the thermoelectric module, and the further metallic basic material 112 can be arranged on a hot side of the thermoelectric module.

A solder can be used as the joining material between the conductor tracks 106, 116 and the thermoelectric material 110. FIG. 1 shows a basic sketch of such a construction. The electric insulation 104, 114 is embodied in each case as a ceramic side. The module is connected by the ceramic side on the cold and/or hot side to metallic heat transfer means 102, 112 made of a metallic basic material.

Figure 2:
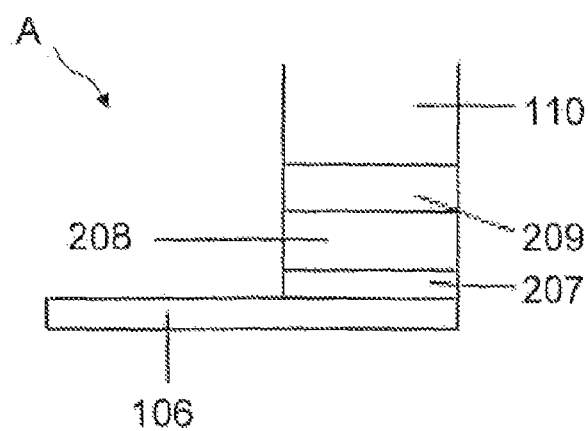
FIG. 2 shows an illustration of a detail of a thermoelectric module.

FIG. 2 shows an illustration of a detail A of a lower base of the thermoelectric material 110 which is illustrated on the left in FIG. 1. A section of the conductor track 106 on which a layer 207 which functions as a diffusion barrier, adhesive layer or the like is arranged is shown. The joining material 208 on which in turn a layer 209 which functions as a diffusion barrier, adhesive layer or the like is arranged is arranged on the layer 207. The thermoelectric material 110 is arranged on the layer 209.

Figure 3:
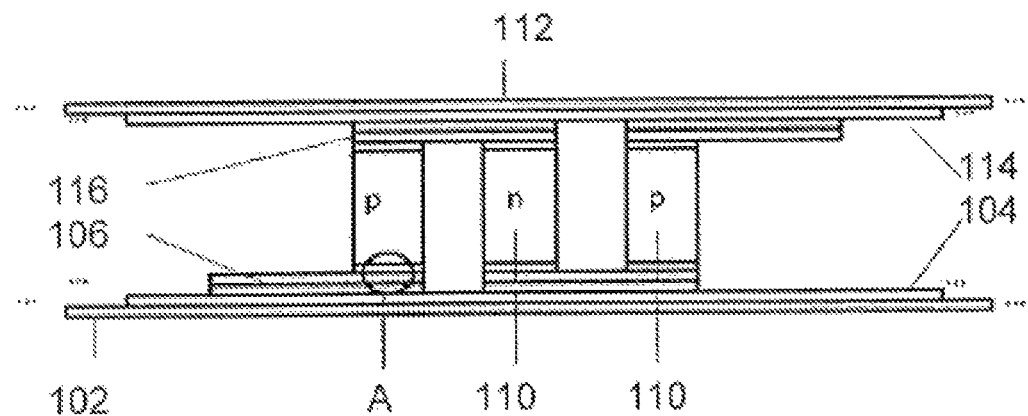
FIG. 3 shows an illustration of a thermoelectric module according to the invention.

FIG. 3 shows an illustration of a thermoelectric module according to the invention in accordance with an exemplary embodiment of the present invention. The thermoelectric module has a layered construction made of a metallic basic material 102, electric insulation 104, conductor tracks 106, thermoelectric p-type and n-type material 110, further conductor tracks 116, further electric insulation 114 and a further metallic basic material 112. During the operation of the thermoelectric module, the metallic basic material 102 can be arranged on a cold side of the thermoelectric module, and the further metallic basic material 112 can be arranged on a hot side of the thermoelectric module.

The metallic basic materials 102, 112 are embodied as two layers which are arranged in parallel and opposite one another. The metallic basic materials 102, 112 form two surfaces of the thermoelectric module lying opposite one another. The metallic basic materials 102, 112 can serve as heat transfer surfaces of the thermoelectric module and as a connection to a heat transfer means not defined here in more detail.

The electric insulation means 104, 114 are embodied as two layers which are arranged in parallel and opposite one another. A surface of the electric insulation 104 is connected to a surface of the metallic basic material 102. A surface of the electric insulation 114 is connected directly adjacently to a surface of the metallic basic material 112, with the result that the surfaces of the electric insulation 114 and of the metallic basic material 112 are in contact. The electric insulation means 104, 114 can each extend over an entire surface of the metallic basic material 112 or at least over regions of the conductor tracks 106, 116. The electric insulation means 104, 114 are designed to insulate the conductor tracks 106, 116 electrically from the metallic basic materials 102, 112.

The electric conductor tracks 106, 116 are arranged in two planes which are arranged in parallel and opposite one another. A multiplicity of conductor tracks 106, 116 is arranged in each of the planes. According to this exemplary embodiment, one of the conductor tracks 106, 116 connects in an electrically conductive fashion in each case two thermoelectric elements which are composed of different thermoelectric material. Adjacent conductor tracks 106, 116 within one plane are arranged spaced apart from one another.

The thermoelectric materials 110 which are illustrated in the form of columns each form a thermoelectric element. In FIG. 3 for example three thermoelectric elements are shown, wherein the thermoelectric element shown on the left is composed of a p-doped semiconductor material, the thermoelectric element shown in the center is composed of an n-doped semiconductor material and the thermoelectric element shown on the right is composed of a p-doped semiconductor material. The thermoelectric module can have a multiplicity of further thermoelectric elements which are arranged adjacent to the thermoelectric elements shown, between further conductor tracks of the conductor tracks 106, 116. The individual thermoelectric materials 110 are arranged spaced apart from one another. Adjacent thermoelectric materials 110 are connected to one another in an electrically conductive fashion only via connecting conductor tracks 106, 116.

An electrical flow of current through the thermoelectric module is possible through the conductor track on the left of the illustrated conductor tracks 106, the material on the left of the illustrated thermoelectric materials 110, the conductor track on the left of the illustrated conductor tracks 116, the middle material of the illustrated thermoelectric materials 110, the right-hand conductor track of the illustrated conductor tracks 106, the right-hand material of the illustrated thermoelectric materials 110 and the right-hand conductor track of the illustrated conductor tracks 116, or vice versa. In this way, the thermoelectric materials 110 are arranged in a series circuit, wherein thermoelectric elements made of a p-doped semiconductor material and thermoelectric elements made of an n-doped semiconductor material are arranged alternately in the series circuit. Two or more thermoelectric materials 110 can also be connected in parallel by means of a suitable arrangement of the conductor tracks 106, 116.

Figure 4:
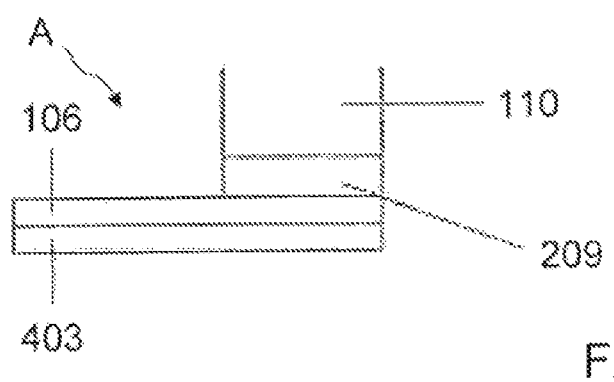
FIG. 4 shows an illustration of a detail of a thermoelectric module according to the invention.

FIG. 4 shows an illustration A of a detail of a lower base of the thermoelectric material 110 which is illustrated on the left in FIG. 3. A section of the conductor track 106 on which a layer 209 which functions as a diffusion layer, adhesive layer or the like is arranged is shown. The layer 209 can be composed of Ag, Ni, Cu, Al, Au, their alloys or similar materials. The thermoelectric material 110 is arranged on the layer 209. A layer 403 which functions as a metallization, adhesive means or the like is arranged under the conductor track 106. The layer 403 can form a surface of the electric insulation. However, it can also be a separate layer composed of Ag, Ni, Cu, Al, Au, their alloy components or the like. The layer 40 is optional. In contrast to the design shown in FIG. 2, no additional joining material is used according to the invention.

Different exemplary embodiments of the present invention are described below with reference to FIGS. 3 and 4.

A ceramic covering layer 104 is located on a metallic basic material 102 as metallic insulation. The ceramic covering layers 104 are generally coated with an adhesive layer 403. This adhesive layer 403 is applied only where conductor tracks 106 are also located. A customary NiAu coating is an example of an adhesive layer 403. In the case of the use of Ag-based conductor tracks 106 this can also be an NiAg layer, Ag layer, or Au layer 403. If the ceramic covering layer 104 is applied to a basic material by means of thermal spraying, it is perhaps possible to dispense with an adhesive layer 403 on the ceramic 104 since the thermal spray layer has a high degree or roughness and when joining occurs it meshes the conductor track material 106 mechanically into the ceramic coating 104. The same applies to the adhesive layer 209 on the thermoelectric materials 110, i.e. the thermoelectric materials 110 are generally coated with an adhesive layer 209 such as, for example, NiAu, NiAg, Ag, Au, Al, Cu, Ni or the like. If the surface of the thermoelectric material 110 has a certain degree of roughness as can be the case, for example, with sintered material or with carrier structures infiltrated with thermoelectric material, it is possible, under certain circumstances, to dispense with adhesive layers 209. This is to be tested in an individual case. As a result of the fact that no separate joining material is used anymore, the number of different materials the thermoelectric module is reduced and therefore also the number of triggers of thermoelectric stresses.

It is basically preferred if the materials used possibly have the same or similar coefficients of thermal expansion in order to reduce the thermal stresses further. If the coefficients of thermal expansion of the materials decrease from the cold side to the hot side in a suitable way, the greater thermal expansion the materials can be compensated on the basis of the relatively high temperature on the hot side.

Firstly, solid metallic glasses (SMG) are proposed as the conductor track material 106. Solid metallic glasses are among the currently most modern classes of material. They are not metallically crystalline in the solid state but instead amorphous. By means of skillful alloying, cooling rates of a few Kelvin per second are already sufficient to suppress the crystallization thereof. An example of the material is an exemplary alloy composed of 41.2% Zr, 13.8% Ti, 12.5% Cu, 10% Ni and 22.5% Be. In addition, there are, however, also alloys based on Pd, Mg, Pt, W, NbNi, Fe, Tu, Cu, etc. Solid metallic glasses have elastic expansion rates of approximately 2%. In comparison to this, stainless steel has approximately 0.2%. For this reason, thermomechanical stresses which occur during operation as a result of different thermal expansion of the two connected materials such as, for example, metal and ceramic can be absorbed in the conductor track joint.

For the purpose of joining, the SMG conductor tracks 106 composed of solid metallic glass are applied in a suitable device, for example a cassette device, to the baseplate, composed of a metallic basic material 102 and ceramic covering layer 104, and the thermoelectric materials 110 are placed over it. By heating the assembly while applying pressure the conductor track 106 is joined to the ceramic covering layer 104 and the thermoelectric material 110 to the conductor track 106. In addition, the conductor tracks 110 of the second baseplate 112, 114 and the second baseplate 112, 114 itself can also be inserted and this can module be joined in one step.

During joining, the maximum temperature of the joining process depends on the selected alloy of the solid metallic glass and on the geometric structure of the parties to the join. The glass transition temperature of the solid metallic glass serves as an orientation guide. For an alloy based on Zr this is 300-400° C., and for an alloy based on NbNi it is approximately 600° C. Since the joining is a pressing process and not soldering with a corresponding chemical bond between the parties to the join and the joining material, it is helpful if the parties to the join are rough. It is particularly preferred if the parties to the join are porous, as is the case with thermal sprayed materials and/or with materials which have been produced by means of powder metallurgy. The pressing temperature has to be selected such that the solid metallic conductor track joining material can penetrate the gaps and pores of the party to the join and therefore mechanical interlocking takes place. The thickness of the solid metallic glass joining material is between 2.0 and 0.2 mm. The lateral dimensions of the SMG conductor tracks 106 are oriented according to the customary dimensions of one to several millimeters in length and width. In order to bring about the interlocking, it is, under certain circumstances, necessary to heat to a temperature above the glass transition temperature. In order to obtain the amorphous metal structure, the time above the glass transition temperature must be reduced to several minutes and be cooled sufficiently quickly. In order to implement the latter, it is possible, for example by pressing on a heated plunger, to feed in heat and subsequently a cooled plunger can be pressed on in order to achieve the desired cooling rate. Another possibility is to heat inductively and subsequently cool with a cold gas stream by means of blowing.

An alternative method for applying the conductor tracks 106 made of solid metallic glasses is thermal spraying using corresponding masks. Advantages are that the sufficiently fast cooling of the sprayed conductor tracks 106 and the interlocking into the ceramic covering layer material 104 are reliably ensured. However, the thermoelectric material 110 has to be applied in an additional step.

With respect to which solid metallic glass is used as a conductor track 106, it is advantageous that the conductor track material has a similar coefficient of thermal expansion to the metallic basic material 102 and the ceramic insulating layer 104. When ferrite stainless steel is used as the basic material 102 and $Al_2O$ or preferably $Al_2O_3/ZrO_2$ mixed oxide is used as the insulating material 104, a solid metallic glass based on Fe, such as amorphous steel or stainless steel, or the exemplary alloy referred to above with a coefficient of thermal expansion of $10 \cdot 10^{-6}$ 1/K is additionally advantageous. In the case of the latter, the glass transition temperature of 300 to 400° C. is to be noted; said temperature must not be exceeded continuously during operation. $CoSb_3$ can advantageously be selected as the thermoelectric material 110 owing to the relatively low coefficient of expansion of approximately 12 ppm/K.

Secondly, sintered materials preferably based on Ag are proposed as an alternative conductor track material. Here, metal pastes can be used which contain a silver compound and which sinter to form a stable porous Ag layer at temperatures below 300° C. or below 200° C. In particular by adding sinter additives, which bring about a reduction in the oxides on the surface or the Ag particles, it is possible to lower the processing temperature to the low values referred to above. The use of nanosilver is not necessary.

The basic joining process takes place essentially in a way analogous to the method when solid metallic glasses are used as conductor tracks 106. The Ag sinter paste is applied to the baseplate, composed of the metallic basic material 102 and the ceramic covering layer 104, at the desired locations by screen printing, stencil printing, dispenser technology or the like. Then, the thermoelectric materials 110 are positioned on the layer made of Ag paste and, if appropriate, pressed on using a cassette-forming device. Subsequently, the assembly is joined either in a pressureless fashion or while applying a pressure of several MPa using temperatures of ≤300° C. In one variant, before the joining the second baseplate 112, 114 which is suitably locally coated with Ag paste is already positioned on the assembly and the entire module is joined in one step. The layer thickness of the conductor track 106 made of Ag paste is typically 50 μm before the joining. However, other layer thicknesses, in particular relatively thick layers, are also suitable.

The Ag conductor track 106 has, after the joining, a residual porosity which depends on the joining parameters, in particular the pressure. Although this residual porosity reduces the electrical conductivity of the conductor tracks 106, the thermomechanical resilience thereof is increased. In view of the relatively high coefficient of thermal expansion of approximately 19 ppm/K of silver this is desirable. A person skilled in the art is aware that the coefficient of thermal expansion of metallic elements such as Ag can be reduced by adding other elements with a relatively low coefficient of thermal expansion such as, for example, Fe, Ta, W, Cr. Such alloyed material based on Ag can be used preferably for the conductor tracks 106.

The silver of the sintered Ag layer has the same melting temperature as solid silver, specifically 962° C., i.e. the Joining seam will not melt even at a high operating temperature of the thermoelectric module of 600° C.

Of course, a module can also be constructed in such a way that the conductor track 106 is composed of a solid metallic glass on one side and of an Ag sinter layer or sinter layer based on Ag on the other side.

Figure 5:
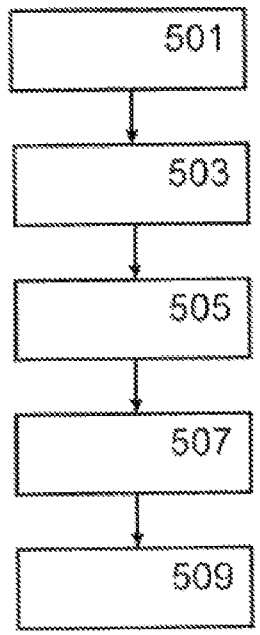
FIG. 5 shows a flowchart of the production of a thermoelectric module.

FIG. 5 shows a flowchart for the production of a thermoelectric module according to an exemplary embodiment of the present invention. The thermoelectric module can be the thermoelectric module illustrated in FIG. 3. In a step 501, electric insulation is provided, to which an electric conductor track is joined in a step 503. In a step 505, a thermoelectric material is joined to the electric conductor track. In a step 507, a further electric conductor track is joined to the thermoelectric material. In a step 509, further electric insulation is joined to the further electric conductor track. The steps 503, 505, 507, 509 can be carried out simultaneously. In further steps, the electric conductor track, the thermoelectric material, the further electric conductor track and the further electric insulation can be provided. In addition, at suitable times metallic basic materials can be provided on both sides and connected to the electric insulation means.

The described exemplary embodiments are selected only by way of example and can be combined with one another.

The invention claimed is:

1. A thermoelectric module comprising:
    an electric insulation;
    an electric conductor track, wherein a surface of the electric conductor track is joined to a surface of the electric insulation; and
    a thermoelectric material, wherein a surface of the thermoelectric material is joined to a further surface of the electric conductor track without use of a separate joining material,
    wherein the electric conductor track consists of a metallic glass, wherein the electric conductor track is in direct contact with both the electric insulation and the thermoelectric material.

2. The thermoelectric module as claimed in claim 1, in which the coefficient of thermal expansion of the electric insulation is lower than the coefficient of thermal expansion of the electric conductor track, and the coefficient of thermal expansion of the electric conductor track is lower than the coefficient of thermal expansion of the thermoelectric material.

3. The thermoelectric module as claimed in claim 1, having a further electric conductor track which is arranged on a side of the thermoelectric material lying opposite the electric conductor track, and having further electric insulation which is arranged on a side of the further electric conductor track lying opposite the thermoelectric material, wherein the further electric conductor track is soldered to the thermoelectric material or the further electric insulation.

4. The thermoelectric module as claimed in claim 1, having adhesive and barrier layers composed of Ag, Ni, Cu, Al, Au, their alloys or the like.

5. A method for producing a thermoelectric module which comprises the following steps:
provide electric insulation;
joining a surface of an electric conductor track to a surface of the electric insulation; and
joining a surface of a thermoelectric material to a further surface of the electric conductor track without using a separate joining material,
wherein the electric conductor track consists of a metallic glass, wherein the electric conductor track is in direct contact with both the electric insulation and the thermoelectric material.

6. The method as claimed in claim 5, in which the joining steps are carried out simultaneously as a pressing process.

7. The method as claimed in claim 5, having a step of laying the electric conductor track composed of metallic glass onto the electric insulation, or having a step of spraying a conductor track material, forming the electric conductor track which is composed of metallic glass, onto the electric insulation.

8. The method as claimed in claim 5, having a step of joining a surface of a further electric conductor track to a surface of the thermoelectric material lying opposite the electric conductor track, and a step of joining a surface of a further electric insulation to a surface of the further electric conductor track lying opposite the thermoelectric material.

\* \* \* \* \*